(12) United States Patent
Chaleix et al.

(10) Patent No.: US 6,454,861 B1
(45) Date of Patent: Sep. 24, 2002

(54) COATING PLANT FOR OBTAINING A COATED SHEET

(75) Inventors: Daniel Chaleix, Boulay; Patrick Choquet, Longeville-les-Metz; Alain Lamande; Colin Scott, both of Metz; Christophe Olier, Nancy, all of (FR)

(73) Assignee: Usinor, Puteaux (FR)

( * ) Notice: Subject to any disclaimer, the term of this patent is extended or adjusted under 35 U.S.C. 154(b) by 0 days.

(21) Appl. No.: 09/695,863

(22) Filed: Oct. 26, 2000

(30) Foreign Application Priority Data

Oct. 26, 1999 (FR) .............................................. 99 13327

(51) Int. Cl.[7] .............................................. C23C 14/00
(52) U.S. Cl. ..................... 118/718; 118/720; 118/726
(58) Field of Search ................................. 118/720, 718, 118/726

(56) References Cited

U.S. PATENT DOCUMENTS 4,416,217 A    11/1983   Nakamura et al. ........... 118/719

FOREIGN PATENT DOCUMENTS

| EP | 1590/69 | 1/1969 |
| JP | 03191053 | 8/1991 |

OTHER PUBLICATIONS

Junji Kawafuku et al., XP000226098, "Structure and Corrosion Resistance of Zinc Alloy Coated Steel Sheets Obtained by Continuous Vapor Deposition Apparatus", Journal of the Iron and Steel Institute, vol. 77, No. 7, Jul. 1991 (Abstract Only).

Primary Examiner—Richard Bueker
(74) Attorney, Agent, or Firm—Young & Thompson

(57) ABSTRACT

The coating plant includes a device for running a sheet to be coated along a traveling path past a window for the evaporation or sublimation of elements A an B, sources for the evaporation or sublimation of elements A and element B placed successively in a direction parallel to the traveling path so as to emit elements A and B through the window and a screen for reducing the angle of emission from the source of element B below the limit represented by an entry edge of the window, the screen being mounted so as to move translationally perpendicular to the traveling path and to move along the traveling path between the source of element A and the source of element B so as to obtain either a -A-AB-A- or a -B-AB-B- coating.

3 Claims, 10 Drawing Sheets

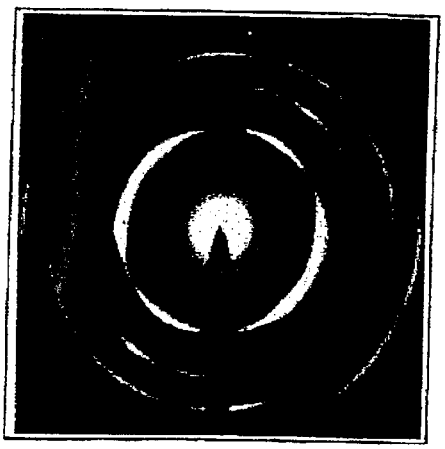
Fig. 6
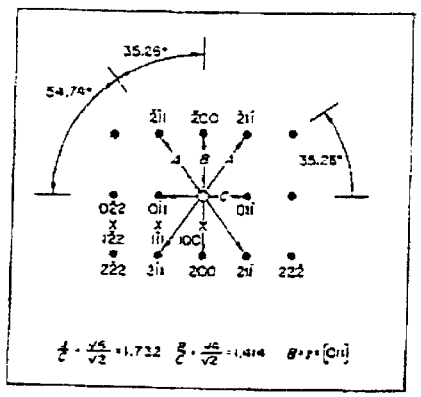 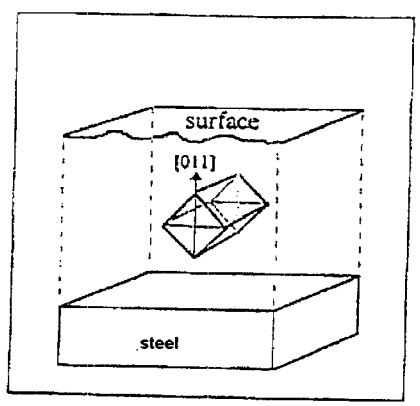
Fig. 7A  Fig. 7B

COATING PLANT FOR OBTAINING A COATED SHEET

FIELD OF THE INVENTION

The invention relates to steel sheets provided with a coating comprising a main layer of zinc-chromium alloy, the predominant phase of which is δ or ζ.

The invention also relates to the plant and the process for obtaining steel sheets coated with a coating of this type of alloy.

BACKGROUND OF THE INVENTION

Document EP 0 607 452 (KAWASAKI) describes the crystalline phases that can be obtained by depositing monolayer coatings of Zn—Cr alloys by electrodeposition and the main properties associated with these phases; depending on the respective proportions of zinc and chromium and depending on the electrodeposition conditions, the following main alloy phases may therefore be distinguished:

- η, having a hexagonal structure identical to that of pure zinc, in which the chromium is in solid solution in small proportions;
- δ, also having a hexagonal structure, the cell parameter a of which is greater than that of the η structure, the cell parameter c of which is less than that of the η structure;
- Γ, having a body-centred cubic structure, the cell parameter of which is greater than that of pure chromium.

Document JP 08-013192 A (KAWASAKI) teaches that annealing a layer of zinc-chromium alloy, the phase of which is δ, transforms the structure of this layer; under treatment conditions which vary depending on the chromium content, the annealing time and the annealing temperature (130° C. to 200° C.), what is obtained is:

a ζ phase, having a monoclinic structure.

FIG. 5 shows the diagram, established by the Applicant, of the amalgamation of the trials for the identification and thermostability of the phases of the Zn—Cr alloys as a function of the chromium content (%) in the particular case of coatings deposited under vacuum by PVD (Physical Vapour Deposition).

On page 9, lines 57–58 of document EP 0 607 452, it is mentioned that, below a 5% chromium weight content in the alloy, the Γ phase will not form in the coating and that, above 30% chromium, the coating obtained does not exhibit good adhesion to the steel.

This information would therefore dissuade someone from using high chromium contents, greater than 30%, especially at the interface between the steel and the coating, in order to avoid impairing the adhesion.

According to that disclosure, in which a layer of zinc-chromium alloy adheres poorly to the steel if the interface between this layer and the substrate is too rich in chromium, it has actually been found that the layers of zinc-chromium graded alloy, produced under vacuum, having a chromium concentration of approximately 15% at the interface and of approximately 5% at the surface, posed problems of adhesion to the steel substrate; by bending a steel sheet coated with such a layer through 180°, a partial debonding of the alloy layer is in fact observed.

The object of the invention is to remedy this drawback.

SUMMARY OF THE INVENTION

For this purpose, the subject of the invention is a steel sheet provided with a coating comprising a main layer of zinc-chromium alloy, the predominant phase of which has a δ and/or ζ structure, characterized in that the said coating also includes a subjacent adhesion layer made of zinc-chromium alloy, sandwiched between the steel of the sheet and the said main layer, which has:

- a Γ-type body-centred cubic crystal structure;
- a chromium weight content high enough to obtain the said Γ structure;
- an at least partial epitaxial junction with the said steel, manifested by the presence of incomplete rings in an electron diffraction pattern of the said sublayer, produced on sections made near the interface with the steel and parallel to this interface.

The invention may also have one or more of the following features:

- the chromium weight content in the said subjacent layer is between 30 and 70%;
- the thickness of the said subjacent layer is between 0.01 $\mu$m and 1 $\mu$m;
- the thickness of the said main layer is greater than 1 $\mu$m; this is because the roughness of the substrate is often of the order of 1 $\mu$m and sometimes greater; in order for the coating to provide effective protection against corrosion and good resistance to red rust, it is important that the coating be sufficiently covering and that its thickness be greater than the roughness of the substrate;
- the said main layer is a layer with a chromium concentration gradient; preferably, the variation in chromium concentration through the thickness of the said main layer is greater than or equal to 10% by weight;
- the chromium concentration in the said main layer may be higher near the surface than near the steel;
- preferably, in order to obtain both effective protection against corrosion and good phosphatizability, the chromium concentration in the said main layer is higher near the steel than near the surface;
- the predominant phase of the main layer has ζ structure;
- the main layer of the coating may only partially have a ζ structure;
- in particular, if the coating is exposed to X-radiation at a grazing angle of incidence of about 3°, the said radiation emanating from an X-ray tube with a cobalt anticathode supplied with 30 kV and outputting 30 mA, emitting a line of wavelength Ka=0.179026 nm, and if the diffraction of this radiation is analysed using a rear monochromator and a scintillation detector, the height of the (131) diffraction line of the ζ-ZnCr phase is between approximately 10% and 100% of the height of the (0002) line of the δ-ZnCr phase.

The subject of the invention is also a process for manufacturing a sheet according to the invention from a sheet to be coated, characterized in that it comprises a step in which the said coating is applied by vacuum deposition to the surface of the said sheet to be coated.

The invention may also have one or more of the following features:

- the said coating is applied by vacuum evaporation and/or sublimation of zinc and chromium;
- the said sheet to be coated is heated during the deposition to a temperature of between approximately 170° C. and 230° C.;
- immediately before the deposition step, the said surface is cleaned and/or brightened suitably for obtaining the said at least partial epitaxial junction, preferably by inert-gas ion bombardment.

The invention also relates to the plants for obtaining, continuously, coatings of alloys, essentially comprising two metal elements, on a sheet, and more particularly coatings of Zn—Cr alloy, by a process for the vacuum deposition of these elements, in which the said sheet is made to run continuously, in succession, past a source of the first alloy metal element and then past a source of the second metal alloy element.

The word "source" in this text may denote an evaporation source or a sublimation source which may be heated by electron bombardment, by conduction (resistance or induction heating), by radiation or by plasma.

In such a process, when the flow rate of vapour emitted by the metal source is low (<1 g/min.cm$^2$), the metal vapour pressure gradient above the source is low and the evaporated or sublimed metal atoms consequently undergo very few collisions. It may therefore be considered that the great majority of atoms propagate between the source and the substrate in a straight line.

On the other hand, if the flow rate of vapour emitted by the metal source is high (>1 g/min.cm$^2$), the metal vapour pressure gradient above the source is high and a great majority of the metal atoms which leave the source will undergo several collisions before reaching the substrate. The dispersion of the metal element over the substrate will accordingly be greater the higher the vapour flow rate.

It is known that, by placing a screen between the source and the substrate seen from this source at a given solid angle, some of the vapour emitted in this solid angle is stopped by this screen and no longer condenses on the substrate. If the vapour flow rate is low and if the residual pressure in the deposition chamber is low, between $10^{-4}$ and $10^{-1}$ Pa, it is practically all of the vapour which will be stopped.

When a strip to be coated runs in succession past an evaporation or sublimation source of a first alloy element A and then past an evaporation or sublimation source of a second alloy element B, as described for example in document JP 06 212410 A (ISHIKAWAJIMA HARIMA HEAVY IND Ltd), the alloy layer obtained is not homogeneous in terms of composition through the depth: richer in element A closer to the substrate than at the surface, richer in element B at the surface than close to the substrate; the alloy layer obtained is termed a "graded" layer.

Document JP 03-191053 (KOBE STEEL) discloses a graded Zn—Cr coating on a steel sheet, in which the chromium concentration at the interface with the substrate is greater than 10% while it is less than 5% at the external surface; such a coating provides both significant corrosion resistance, because of the high chromium concentration in the depth, and good phosphatizability, because of the low chromium concentration at the surface.

To obtain such a graded Zn—Cr coating using the aforementioned process, i.e. richer in chromium on the substrate side than at the surface, it is necessary to make the strip to be coated run firstly past the chromium source and then past the zinc source; in general, to obtain a graded coating of alloy AB, richer in element A on the substrate side than at the surface, it is necessary to make the substrate run firstly past the source A and then past the source B.

The vacuum deposition plants comprise:
means for running the sheet or strip of sheet;
an evaporation and/or sublimation chamber open to an evaporation and/or sublimation window emerging in a region of the path along which the sheet runs;
at least one source of elements to be deposited, placed in this chamber so as to emit through the window.

The useful solid angle of emission from a source is in general bounded by this window; it encompasses the possible trajectories of elements liable to condense on the substrate.

In the deposition plants comprising a source of element A and a source of element B for producing a coating comprising a layer of alloy AB, the A and B sources are placed in the same chamber so as to emit through the same window; if the A and B sources are placed at the same distance from this window, the useful angle of emission from each element is identical.

In the case of plants suitable for producing graded layers in which the strip to be coated runs in succession firstly past an A source and then past a B source which emit through the same window, document JP 06 212410 A, already mentioned, describes the use of screens, "masks" or "stops", in order to obtain multilayer coatings comprising a graded layer of alloy AB and a layer of pure element A and/or a layer of pure element B.

Processes for obtaining such multilayer coatings using these plants will now be described with reference to FIGS. 1 to 3: the arrow x indicates the running direction of the substrate to be coated.

The window through which the A source and the B source emit have two edges; these edges are positionally adjustable (i.e. vertically and/or laterally) and thus form stops; the edge which is located on the A source side is called the "A entry edge" and the edge which is located on the B source side is called the "B exit edge".

Referring to FIG. 2, if the A entry edge is placed at a height $h_x$ from the path along which the strip runs (and not near it), upon entering the deposition zone a'a", the element B will be mostly deposited, and a —B(+A) —AB-type bilayer coating will be obtained, in which the B(+A) sublayer will have an A content which will depend mainly on the flow rate of vapour from the source and on the residual pressure in the deposition chamber and in which the AB layer is richer in element A on the substrate side than at the surface. For the sake of simplification, a -B-AB-type coating will subsequently be used to describe a -B(+A)-AB-type coating.

If the running direction of the strip is reversed, an -AB-B(+A)-type bilayer coating is then obtained, in which the AB sublayer is richer in element B on the substrate side than at the surface.

Referring to FIG. 1, if the B exit edge is placed at a distance $h_y$ from the path along which the strip runs (and not near it), upon exiting the deposition zone b'b", mostly element A will be deposited and an -AB-A(+B) (or, more simply, -AB-A)-type bilayer coating will be obtained, in which the A(+B) layer will have a B content which will depend mainly on the flow rate of vapour from the source and on the residual pressure in the deposition chamber and in which the AB sublayer is richer in element A on the substrate side than at the surface.

If the running direction of the strip is reversed, a -B(+A)-AB-type bilayer coating is then obtained, in which the AB layer is richer in element B on the substrate side than at the surface.

It may therefore be seen that, in the running direction of the strip as indicated in FIGS. 1 and 2, such an arrangement of the edges of the useful emission window for elements A and B makes it possible to produce -B-AB-type and -AB-A-type bilayer coatings; by combining the two arrangements of A and B edges as illustrated in FIG. 3, -B-AB-A coatings are obtained in which the AB layer is always richer in element A on the substrate side than at the surface.

The direct effect of such an arrangement of the A and/or B edges, which consists in placing them at a distance $h_x$ and/or $h_y$ from the path along which the sheet runs, is to widen the two useful solid angles of emission of element A and of element B; increasing the distance $h_x$ from the A entry edge further increases the useful angle of emission of element B, the source of which is further away than that of element A, the source of which is closer, and therefore leads to the formation of a layer of element B beneath the layer of alloy AB; increasing the distance $h_y$ of the B exit edge further increases the useful angle of emission of element A, the source of which is further away than that of element B, the source of which is closer, and therefore results in the formation of a layer of element A on the layer of alloy AB; in general, increasing the distance of an edge further widens the useful angle of emission of an element whose source is further away and therefore results in the formation of a pure layer (or, in the majority of cases, weakly alloyed) of this element above or below the layer of alloy AB; the effect is all the more pronounced the greater the distance between the sources.

The object of the invention is to produce, apart from the coatings proposed in the document JP 06 212410 A, coatings of the A-AB-A type or the B-AB-B type, in which the AB layer is always richer in element A on the substrate side than at the surface if the strip runs from the A source towards the B source.

Of course, if the direction of the strip is reversed, it is possible to obtain the same types of coatings as before, but in this case the AB layer becomes richer in element B on the substrate side than at the surface.

For this purpose, the subject of the invention is a coating plant for obtaining a sheet, comprising, if A denotes chromium and if B denotes zinc:

an apparatus for running the sheet to be coated past a window for the evaporation or sublimation of element A and/or B, a source for the evaporation or sublimation of element A and a source for the evaporation or sublimation of element B, these being placed successively in a direction parallel to that of the said running and in the direction of this running, so as to emit through the same window at a useful emission angle limited by the said window, the sheet to be coated running from an entry edge to an exit edge of the said window, characterized in that it comprises means for reducing the angle of emission from the source of element B below the limit represented by the exit edge, the said means for reducing the angle of emission from the source being mounted so as to move translationally perpendicular to the running of the sheet, it being possible for their position to vary between the source of element A and the source of element B so as to obtain either the -A-AB-A-type or the -B-AB-B-type coating.

The invention may also have the following features:

the plant also includes means for reducing the angle of emission from the source of element A below the limit represented by the exit edge, it being possible for the position of the said means to vary between the source of element A and the source of element B so as to obtain either the -A-AB-A-type or the -B-AB-B-type coating;

the said means for reducing the angle of emission are formed by at least one screen placed between the source of element A and the source of element B, it being possible for the position of the said means to vary between the source of element A and the source of element B so as to obtain either the -A-AB-A-type or the -B-AB-B-type coating.

In the particular case of coatings of Zn—Cr alloy, reducing the angle of emission from the source of element Cr below the limit represented by the exit edge, a surface layer even richer in zinc is obtained, this being favourable to phosphatizability.

On the other hand, by reducing the angle of emission of the source of element Zn below the limit represented by the exit edge, a surface layer even richer in chromium is obtained, thereby favouring the direct adhesion of an organic coating.

According to a preferred embodiment of the invention, the said means for reducing the angle of emission are formed by a vertical movable screen placed between the source of element A and the source of element B.

Advantageously, it is possible, during the operation of the said process, for the positions of the vertical movable screen and of the entry and exit edges to be adjusted simultaneously. By doing this, the same thickness for the two sublayers is maintained even if the line speed, the level of the charges A and B in the crucibles of the sources or the evaporation rates are modified.

FIG. 4 illustrates in a non-limiting manner such a plant, which will be described in more detail later in the particular case of a coating comprising a main layer of zinc-chromium alloy.

The plant may obviously be used to coat continuous strips of sheet.

By virtue of this arrangement, it is possible to produce coatings comprising a layer of AB alloy richer in element A on the substrate side, of the -A-AB type, by reducing the angle of emission from the B source below the limit represented by the A entry edge, of the -AB-B type, by reducing the angle of emission from the A source below the limit represented by the B exit edge, of the -A-AB-B type, by combining the above two means.

If a vertical movable screen is used, these various alternative embodiments may be obtained by varying the position of this screen between the source of element A and the source of element B or by using two screens.

Combining with the means described above and illustrated in FIGS. 1 to 3, it is therefore possible to produce multilayer coatings which are not achievable using the vacuum deposition apparatuses and processes described in the prior art, of the -A-AB-A type or of the -B-AB-B type, in which the layer of alloy AB is richer in element A on the substrate side.

The sheet according to the invention will now be described in more detail.

It is known that chromium crystallizes in an a body-centred cubic system, the cell parameter $a_0$ of which is approximately 0.2884 nm (source: W. B. Pearson, *Handbook of Lattice Spacings and Structure of Metals and Alloys*, Pergammon Press); it is also known that a zinc-chromium alloy rich in chromium crystallizes in the same body-centred cubic system, with a larger cell parameter, the value $a_0'$ of which is generally between 0.296 and 0.301 nm; the minimum amount of chromium needed to obtain a zinc-chromium alloy having this body-centred cubic structure depends on the conditions under which the alloy was prepared: referring to FIG. 5, which shows the diagram established by the Applicant from the amalgamation of tests for the identification and thermostability of the phases of Zn—Cr alloys as a function of the chromium content (%) obtained by the PVD (Physical Vapour Deposition) process, it may be seen that the minimum weight content of chromium in order to obtain this $\Gamma$ structure thus varied from approximately 20 to 34%, depending on these preparation conditions.

Because of the body-centred cubic structure of the subjacent layer of zinc-chromium alloy rich in chromium according to the invention, it has proved to be possible to obtain a partial epitaxial junction between this alloy and steel.

The expression "partial epitaxial junction" is understood to mean that, at the interface between the substrate and the subjacent layer of this alloy in the body-centred cubic form, there is continuity between some of the ferrite crystals of the steel at this interface and some of the body-centred cubic crystals of the Zn—Cr alloy at this same interface.

Thus, according to the invention, by sandwiching a subjacent layer of Zn—Cr alloy of body-centred cubic structure between a steel substrate and a main layer of Zn—Cr alloy much leaner in chromium, which does not crystallize in the Γ body-centred cubic form and is intended to provide effective protection of the steel against corrosion, the adhesion of this main protective layer to the substrate is very greatly improved as long as a partial epitaxial junction between the steel and this interlayer is established.

One way of checking that the junction between the steel and this interlayer has a partial epitaxial nature consists in producing an electron diffraction pattern from thin foils obtained by cutting in the plane of the interlayer, near the interface with the steel.

FIG. 6 illustrates the pattern obtained when the junction is epitaxial in nature: it may be seen that the diffraction rings form interrupted lines and are not complete, indicating that the orientation of the body-centred cubic grains of the interlayer in the cutting plane is not random and that there is a partial epitaxial relationship with the grains located below the cutting plane, that is to say with the steel grains; in addition, the angle between the position of maximum intensity of the ring which corresponds to the {011} crystallographic planes of the Γ-ZnCr phase and that of the {200} planes is 90°, thereby indicating a growth texture of the [011] type.

FIGS. 7A and 7B show, respectively:
- the [011] (crystallographic notation) direction zone for a crystal lattice of the body-centred cubic type, of the type of that of the Zn—Cr alloy rich in chromium of the interlayer according to the invention;
- the preferred [011] orientation for the growth of the grains of this interlayer, during its deposition on the steel substrate.

It has been found that the subjacent layer according to the invention could significantly improve the adhesion of the coating as long as its thickness exceeds 0.01 μm; very good results have been obtained with a thickness of approximately 0.02 μm; since the Γ phase is brittle in nature, it is essential to prevent this layer from being too thick, in order to avoid problems when forming the coated sheet; thus, preferably the thickness of this layer is less than 1 μm.

In particular, the invention is used to improve the adhesion of graded Zn—Cr layers, the chromium content of which is greater in the depth than at the surface, such as the layers described in the abovementioned document JP 03-191053.

A variant of the invention consists in subjecting the sheet obtained to a heat treatment so as to transform, at least partly, the δ phase of the main layer of the coating into the ζ phase, as described for example in document JP 08-013192 which indicates that such a treatment makes it possible to improve the resistance of the sheet to red rust.

In order to prepare a coated steel sheet according to the invention, it is preferred to use a vacuum deposition process since this type of process allows the proportions of chromium and zinc, which vary through the thickness of the coating: higher chromium content near the steel in order to form the adhesion interlayer according to the invention, lower chromium content near the surface, to be more easily controlled.

Another variant of the invention for transforming, at least partly, the δ phase of the main layer of the coating into the ζ phase when the deposition is carried out under vacuum consists in carrying out the deposition on a substrate heated to a temperature above 170° C.; by observation in section using a scanning electron microscope, it is found that the microstructure of the main layer of the coating is modified:
- at 150° C., a morphology similar to that obtained without preheating is observed: the main layer exhibits a columnar morphology, the crystals of which are oriented perpendicularly to the surface of the substrate or to the plane of the layer, and extend over the entire thickness of this layer (thickness about 5 μm); the grain boundaries therefore pass right through the layer;
- at 200° C., the main layer exhibits a "duplex" morphology: from the surface as far as about mid-thickness of the layer, the morphology remains columnar whereas, further into the depth, the morphology is virtually equiaxed; X-ray diffraction analysis shows that the Zn—Cr alloy deposited is partially transformed to the ζ phase. Under the following X-ray diffraction analysis conditions: X-ray tube, cobalt anticathode (30 kV–30 mA with Ka=0.179026 nm), rear monochromator and scintillation detector, grazing-incidence device (angle of incidence a=3°), the height of the (131) line of the ζ-ZnCr phase is equal to or slightly less than the height of the (0002) line of the δ-ZnCr phase;
- at 240° C., the layer obtained is entirely transformed (equiaxed morphology) but has a low density because of the partial re-evaporation of the zinc under the vacuum deposition conditions.

Thus, according to this variant, which is aimed at obtaining a coating whose main layer is at least partially transformed to the ζ phase, the sheet to be coated is preferably heated between 170° C. and 230° C.; by heating the substrate in the approximately 170 to 200° C. range, coatings are obtained whose main layer is two-phased, for which the height of the (131) line of the ζ-ZnCr phase is between approximately 10 and 100% of the height of the (0002) line of the δ-ZnCr phase.

Without subsequent heat treatment, it is thus possible to produce a coating whose main layer has a ζ predominant phase.

By carrying out a suitable heat treatment after the deposition, it is possible, where appropriate, to completely transform the structure of the main layer into the ζ phase of equiaxed morphology having, over the entire thickness of this layer, grains of very small size, for example a size of between 10 and 200 nm.

One advantage of this variant of the invention is that a subsequent treatment of the type carried out for baking a coat of paint suffices to complete the transformation of a sufficient amount of the δ phase into the ζ phase in order to obtain the best corrosion resistance; it is therefore no longer necessary to carry out a specific subsequent heat treatment in order to improve the corrosion resistance.

Since the ζ phase is predominant in the coating, an appreciable increase in corrosion protection provided by this coating is observed compared with the coating of the same thickness and the same composition but whose predominant phase is the δ phase; this improvement stems, at least in part, from the microcrystalline structure obtained by heating the substrate during and/or after coating; indeed, the fact that grain boundaries no longer pass directly right through the layer, as in the case of the columnar morphology, could explain the appreciable improvement in the corrosion resistance.

The subjacent adhesion layer according to the invention is particularly advantageous because, even in the case of deposition on a heated substrate and/or in the case of subsequent heat treatments, the Γ phase of this subjacent layer is very temperature stable and continues to provide the specific effect of the invention of improving the adhesion of the coating, even after the δ phase has been transformed into the ζ phase.

BRIEF DESCRIPTION OF THE DRAWINGS

The invention will be more clearly understood on reading the description which follows, given by way of non-limiting example and with reference to the appended figures in which:

FIG. 6 illustrates the electron diffraction pattern obtained when the junction between the substrate and the subjacent layer according to the invention is epitaxial in nature;

FIGS. 7A and 7B show respectively the [011] direction zone of the subjacent layer according to the invention and the [011] preferred orientation for the growth of the grains of this layer;

DETAILED DESCRIPTION OF THE INVENTION

Figure 1:
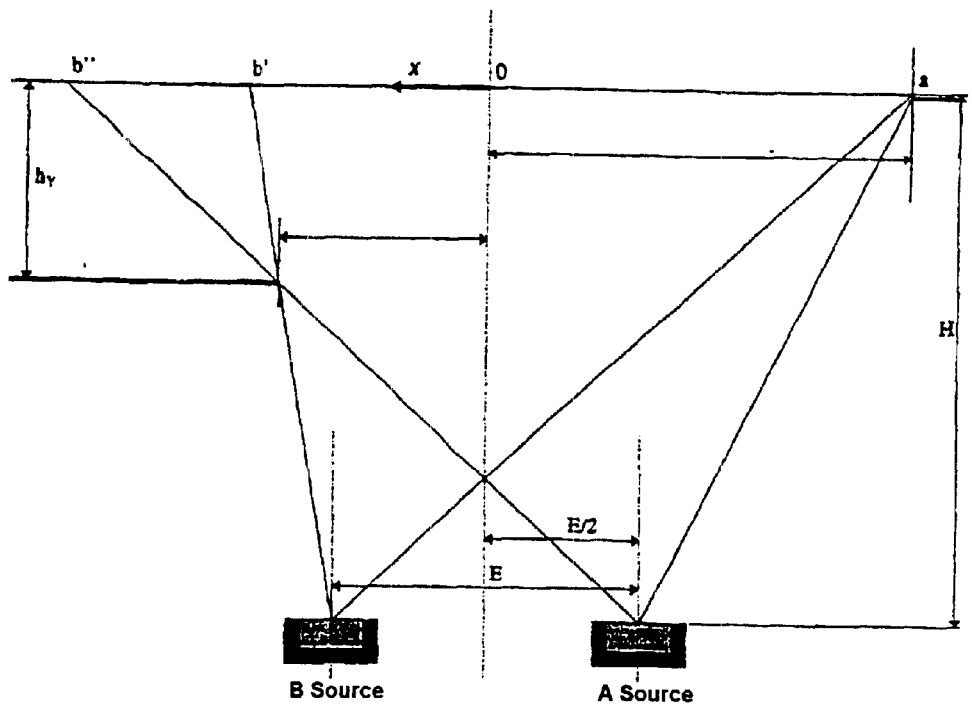
FIGS. 1 to 3 describe diagrams of an evaporation and/or sublimation chamber for the vacuum deposition of a coating comprising a main layer of alloy AB richer in element A on the substrate side than at the surface, consisting of the stack -AB-A, -B-AB and -B-AB-A.
Figure 2:
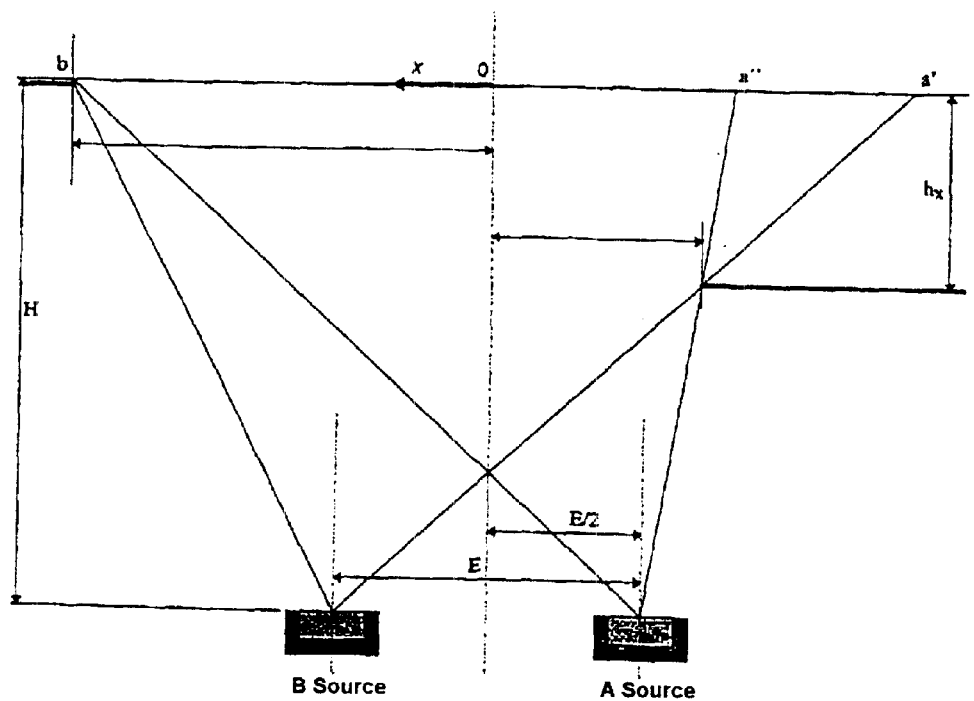
Figure 3:
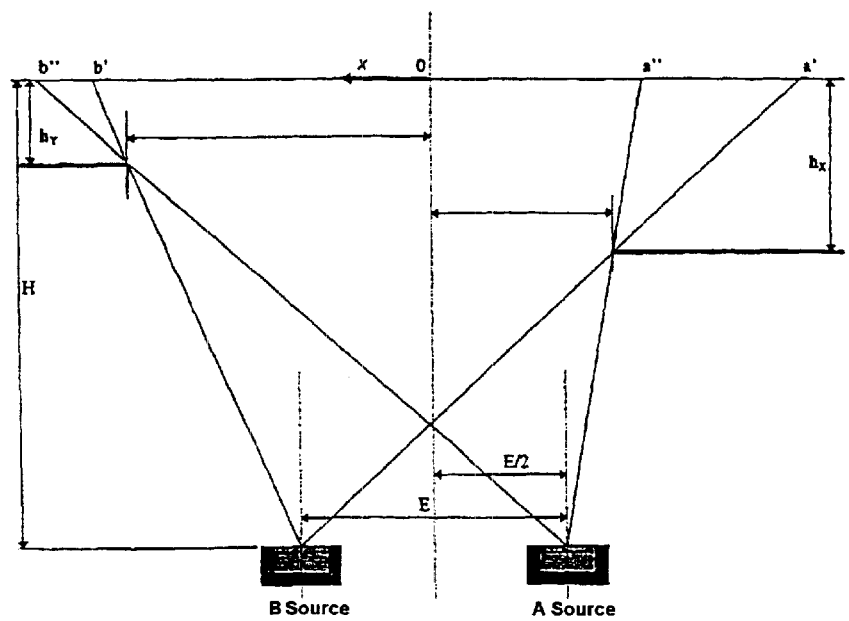

To illustrate one method of preparing a sheet according to the invention, a conventional process for depositing a zinc-chromium alloy is used, in this case a vacuum deposition process; other processes could be used, such as electrodeposition as described in the abovementioned document EP 0 607 452.

In order to obtain, according to the invention, the partial epitaxial junction between the steel and the coating, it is important to start with a steel surface which is clean and reactive, like that obtained directly at the exit of a line for continuous annealing carried out in a reducing atmosphere.

If the surface is not sufficiently clean and reactive, it is then important to carry out a prior cleaning and brightening operation under conditions making it possible to obtain, according to the invention, the partial epitaxial junction between the steel and the coating.

This is achieved, for example, by using a plasma treatment or an ion bombardment treatment; in the case of an ion bombardment by an argon ion beam, the necessary bombardment density preferably exceeds $10^{16}$ ions/cm$^2$ of surface to be cleaned.

The conditions for cleaning and brightening the surface are tailored in a manner known per se in order to obtain as clean and as reactive a surface as after annealing, for example using the process described in FR 2 757 880 (SOLLAC) depending on the signal intensity of at least one trace element at the surface to be coated.

The rest of the preparation of the sheet according to the invention will now be described, by way of illustration of the invention, through the application of a coating comprising a main layer of graded zinc-chromium alloy richer in chromium near the substrate than near the surface, tailored both to provide effective corrosion protection and good phosphatizability, and, for this purpose, the use of a vacuum deposition plant of the PVD (Physical Vapour Deposition) type having particular arrangements.

Conventionally, the vacuum deposition plant includes means for running the sheet or strip of sheet, an evaporation and/or sublimation chamber open to an evaporation and/or sublimation window emerging in a region of the path along which the sheet runs.

To prepare such a coating, the PVD vacuum deposition plant is preferably set up as follows with reference to FIG. 4:

as zinc and chromium sources, two separate crucibles placed in the evaporation and/or sublimation chamber are used, one chamber 1 for the sublimation of pure chromium and the other chamber 2 for the evaporation of pure zinc; other known arrangements allow zinc-chromium alloys to be deposited, such as a single crucible containing a zinc-chromium alloy, but these are not suitable here since the use of a single crucible would not allow a graded main layer to be obtained;

the two crucibles 1, 2 are placed in succession in a direction parallel to that in which the sheet runs, thereby making it possible to obtain a graded layer;

in the running direction of the sheet (arrow 12 at the top of FIG. 4), along this parallel direction, there is firstly the chromium crucible 1 and then the zinc crucible 2; thus, the graded layer obtained is richer in chromium on the substrate side than at the surface side, in accordance with the pursued objective in this particular embodiment of the invention.

The evaporation or sublimation window past which the sheet to be coated runs is bounded, in the direction perpendicular to the running direction, by an entry edge 3 on the crucible 1 side and by an exit edge 4 on the crucible 2 side.

Figure 4:
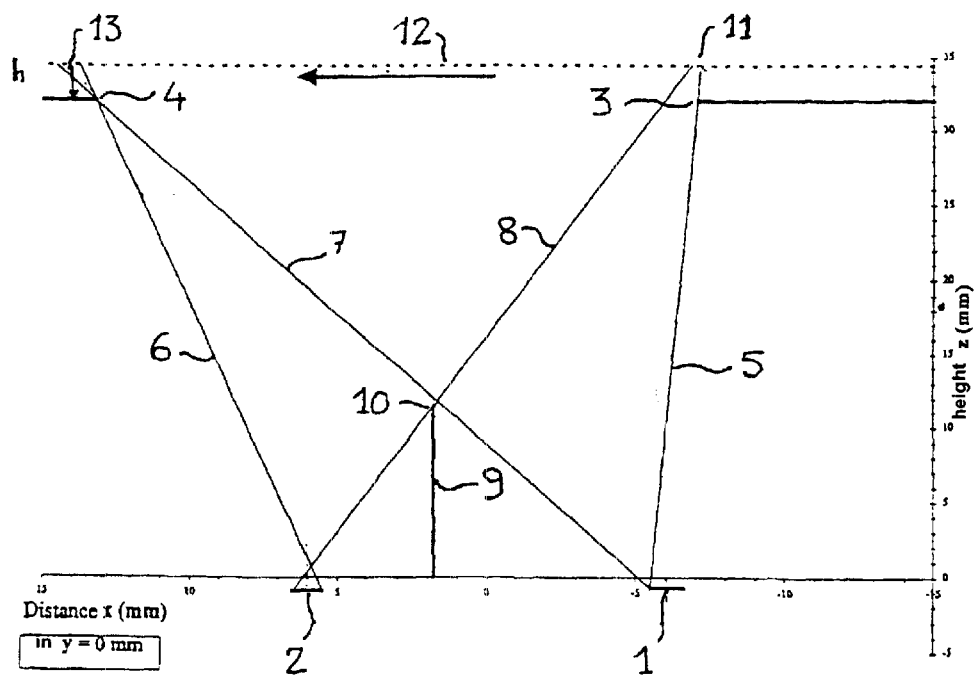
FIG. 4 describes a diagram of a chamber equipped according to the invention with a screen 9 so as to obtain a coating consisting of the stack -A-AB-A.
Figure 5:
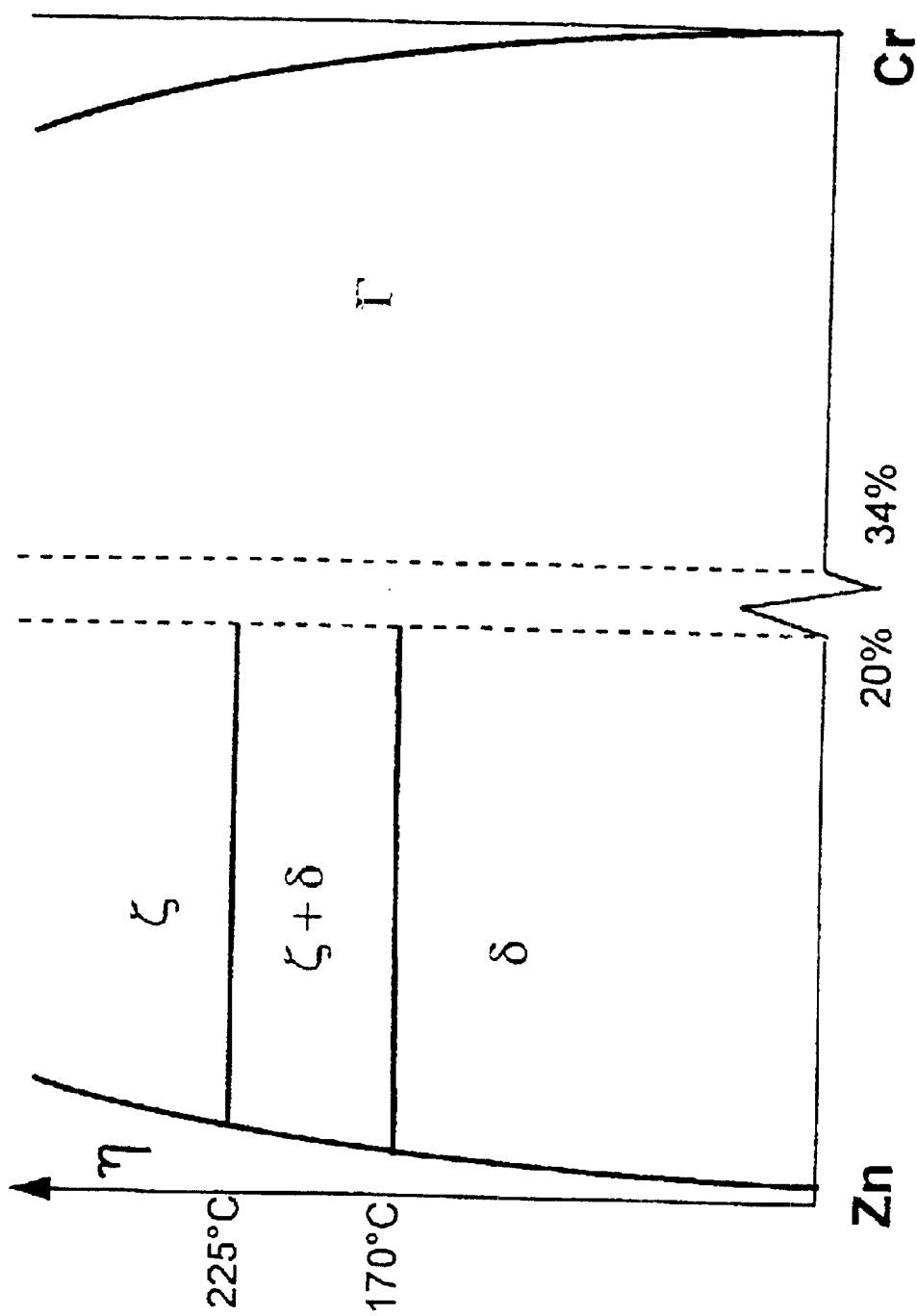
FIG. 5 shows the diagram, established by the Applicant, from the amalgamation of tests for the identification and thermostability of the phases of the Zn—Cr alloys as a function of the chromium content (%) in the particular case of coatings deposited under vacuum by PVD (Physical Vapour Deposition)

Thus, in FIG. 4, the entry edge 3 defines the right-hand limit 5 of the solid angle of emission from the chromium crucible 1 and the exit edge 4 defines the left-hand limit 6 of the solid angle of emission from the zinc crucible 2.

In the absence of other arrangements, the entry edge 3 would also define the right-hand limit of the solid angle of emission from the zinc crucible 2, the exit edge 4 defines the left-hand limit 7 of the solid angle of emission from the chromium crucible 1.

Since these edges 3 and 4 always lie, in practice, at a non-zero distance h from the path along which the sheet runs:

on the side with the exit edge 4 which fixes the left-hand limits 6, 7 of the zinc and chromium emission angles respectively, the chromium emission solid angle is wider than the zinc emission solid angle and a region 13, on which chromium elements predominantly condense after the main alloy layer has been deposited, is formed on the running path;

on the side with the entry edge 3 which fixes the right-hand limit 5 of the chromium emission angle and would fix the right-hand limit of the zinc emission angle in the absence of other arrangements, the zinc emission solid angle would be wider than the chromium emission solid angle and a region, on which zinc elements would predominantly condense before the main alloy layer has been deposited, would be formed on the running path.

Thus, by carrying out the deposition in the absence of other arrangements; what would be obtained is a sheet provided with a coating comprising:

a subjacent layer of zinc or zinc-chromium alloy rich in zinc;

a main layer of graded zinc-chromium alloy;

a surface layer of chromium or zinc-chromium alloy rich in chromium.

Such a coating gives rise to adhesion problems, that the presence of the subjacent layer of zinc or zinc-chromium alloy rich in zinc aggravates, problems that the invention aims to solve.

Thus, in order to obtain a subjacent adhesion layer according to the invention, in the PVD vacuum deposition plant, a translationally movable vertical screen 9 is furthermore placed in a plane perpendicular to the running direction, the position of which may vary between the crucible 1 (source of element A) and the crucible 2 (source of element B), closer to the zinc crucible 2 than the chromium crucible 1 so as to reduce the angle of emission from the zinc crucible 2 below the right-hand limit which would have been defined by the entry edge 3, that is to say so that the upper edge 10 of this movable vertical screen 9 now defines the right-hand limit 8 of the solid angle of emission from the zinc crucible 2.

As regards the left-hand limit 7 of the solid angle of emission from the chromium crucible 1, this is still defined by the exit edge 4 of the evaporation or sublimation window and is not affected by the movable vertical screen 9.

By virtue of this screen 9, thus positioned according to the invention, there exists in the window a region through which essentially "chromium" elements pass so as to form, on the other side of the window on the running sheet, a region 11 on which mostly chromium elements condense.

Thus, after having prepared the surface to be coated, by making the sheet run through this plant provided with these arrangements, including especially the screen 9:

first, in the region 11, a subjacent layer rich in chromium is formed, the thickness of which is proportional, among other parameters, to the width of the region 11, this width being adjustable by varying the position of the screen 9;

in the region 12 where both zinc and chromium condense, a main layer of graded zinc-chromium alloy is then formed, the chromium concentration of which is higher on the substrate side than the surface side;

next, in the region 13, a surface layer, rich in chromium like the subjacent layer, is formed, the thickness of which is proportional to the distance h between the exit edge 4 and the path along which the sheet runs.

The thickness of the coating, and therefore of each layer, is obviously proportional to the running speed of the sheet and to the rate of evaporation or sublimation.

In order to reduce the angle of emission from the source of element Zn below the limit represented by the entry edge 3, it would be possible, without departing from the invention relating to the arrangements of the plant, to use means other than the screen 9 described above: for example, it would be possible to use the crucible 1 as a screen for the elements emitted by the crucible 2, by placing it at a suitable height in the evaporation and sublimation chamber.

To obtain a coating whose main layer has a composition which, in terms of weight of chromium, varies from 15% near the substrate to 5% near the surface and whose thickness is 4.5 $\mu$m, the following are calculated in a manner known per se:

the conditions relating especially to the evaporation rate, the sublimation rate and the running speed;

the conditions relating to the adjustment of the electron beams for bombarding the surface of the crucibles, according, also, to the required evaporation cones.

For example, the process is carried out under the following conditions:

zinc evaporation rate: 70.0 mg/s;

chromium sublimation rate: 3.5 mg/s;

sheet running speed: 5 cm/min.

The pressure in the coating plant is about $10^{-3}$ Pa; at this pressure, the mean free path of the evaporated or sublimed atoms is greater than 50 cm, which means that most of the atoms leaving the crucibles in the direction of the evaporation or sublimation window propagate in straight lines and do not undergo collisions.

In practice, based on the dimensions of the chamber and of the evaporation and sublimation window, on the position and on the characteristics of the crucibles 1, 2, on the variation in the levels of the zinc and chromium charges in these crucibles during the application of the coating to the sheet, the position of the screen 9, with respect to the two crucibles and in terms of height, and the shape of its upper edge 10 are calculated in order to obtain the desired thickness of the subjacent layer rich in chromium and a constant thickness of this subjacent layer over the entire width of the sheet.

Thus, after having carried out this process, including a step of preparing the surface of the sheet and a step of PVD vacuum deposition by running the sheet over the evaporation and/or sublimation window, what is obtained is a steel sheet provided with a coating having a total thickness of about 5 μm and comprising:

a subjacent layer of zinc-chromium alloy much richer in chromium than the main layer, the mean chromium weight content of which is greater than 34%, having a thickness of about 0.2 μm;

a main layer of graded zinc-chromium alloy, the mean chromium weight content of which is about 10%, having a thickness of 4.5 μm.

In practice, given the short distance h (cf. FIG. 4) separating the exit edge 4 from the region 13, a surface layer of zinc-chromium alloy much richer in chromium than the main layer was not observed.

Without departing from the invention, the coating may include such a surface layer, especially if the exit edge 4 is moved further away from the region 13.

The physico-chemical characteristics and the properties of the sheet obtained will now be described in greater detail.

Figure 9:
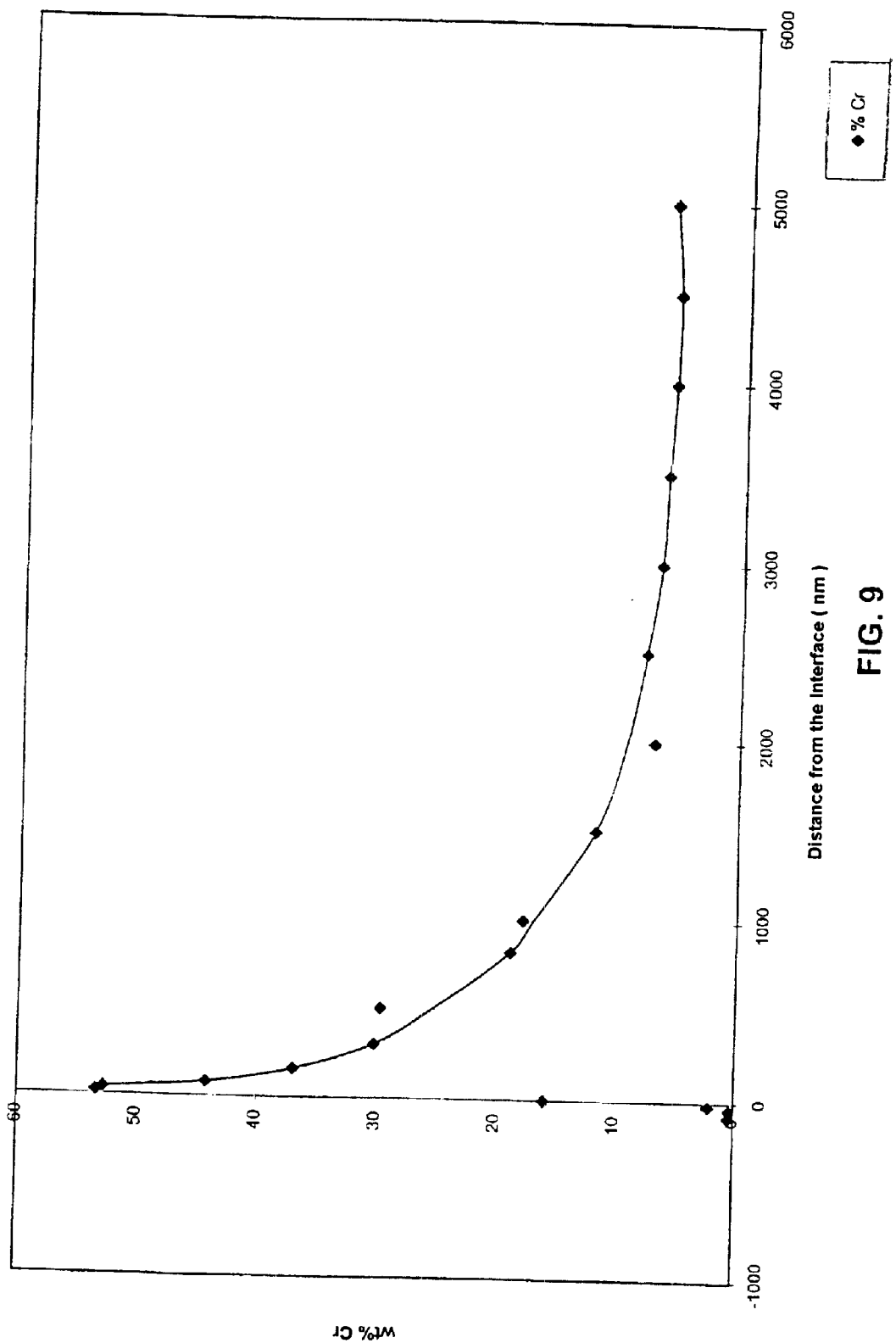
FIG. 9 illustrates the variation in the Cr concentration (% by weight) as a function of the distance from the interface with the substrate ($\mu$m) for a specimen similar to that in FIG. 8B, after annealing at 225° C. for 60 min., evaluated by EDX (Energy Dispersive X-ray) analysis using TEM (Transmission Electron Microscopy)

1—Analysis of the Weight Content of Elements Through the Thickness of the Sheet, Especially Through the Coating:

zinc, chromium, iron and carbon contents by glow discharge spectroscopy, as a function of the erosion time: FIG. 8B;

chromium content as a function of the distance (μm) from the steel-coating interface, by EDX analysis (Energy Dispersive X-ray analysis) using a transmission electron microscope on a thin foil of a cross section of sheet, according to the invention, obtained by an FIB (Focused Ion Beam) method that does not damage the section: FIG. 9.

The FIB method is described in the article written by K. Kuroda, M. Takahashi, T. Kato, H. Saka and S. Tsuji, entitled "Application of focused ion beam milling to cross-sectional TEM specimen preparation of industrial materials including heterointerfaces", published in the journal *Thin Solid Films*, 319 (1998), pp. 92–6.

The glow discharge spectra clearly show the increase in the concentration and the decrease in that of chromium in the main layer of the coating, which demonstrates that this main layer of Zn—Cr alloy is indeed "graded"; the increase in the signal due to zinc at the surface does not reflect a higher zinc concentration but is merely an artefact due to the analytical method, zinc having a sputtering coefficient four times greater than that of chromium.

The EDX analysis shows a general profile in which the chromium concentration in the main layer of the coating decreases down to approximately 5% by weight near the surface; this analysis reveals the presence of the subjacent layer of zinc-chromium alloy according to the invention, which is much richer in chromium (greater than 34% by weight) than the main layer near this substrate, the chromium concentration of which does not exceed 30% by referring to the previous analyses.

Figure 10:
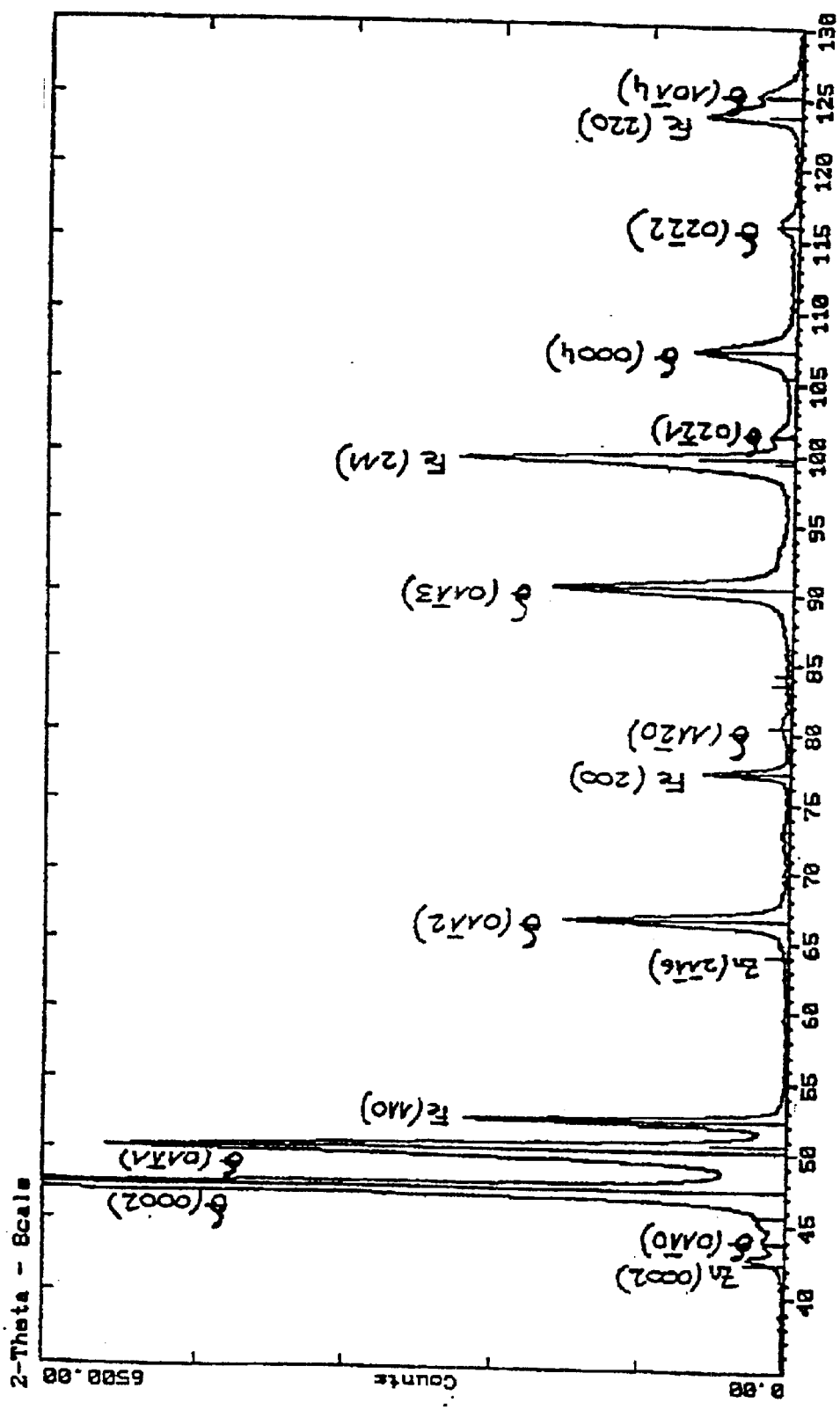
FIG. 10 is an X-ray diffraction pattern taken at the surface of a sheet provided with a coating according to the invention, the main layer of Zn—Cr alloy of which has a δ structure.

2—Analysis of the Crystalline Phases in the Coating:

2.1: by XRD (X-Ray Diffraction) with regard to the main layer of the coating:

As shown by the X-ray diffraction pattern taken at the surface of the sheet—FIG. 10, the Zn—Cr alloy of the main layer of the coating is almost entirely composed of the hexagonal δ phase.

Figure 11:
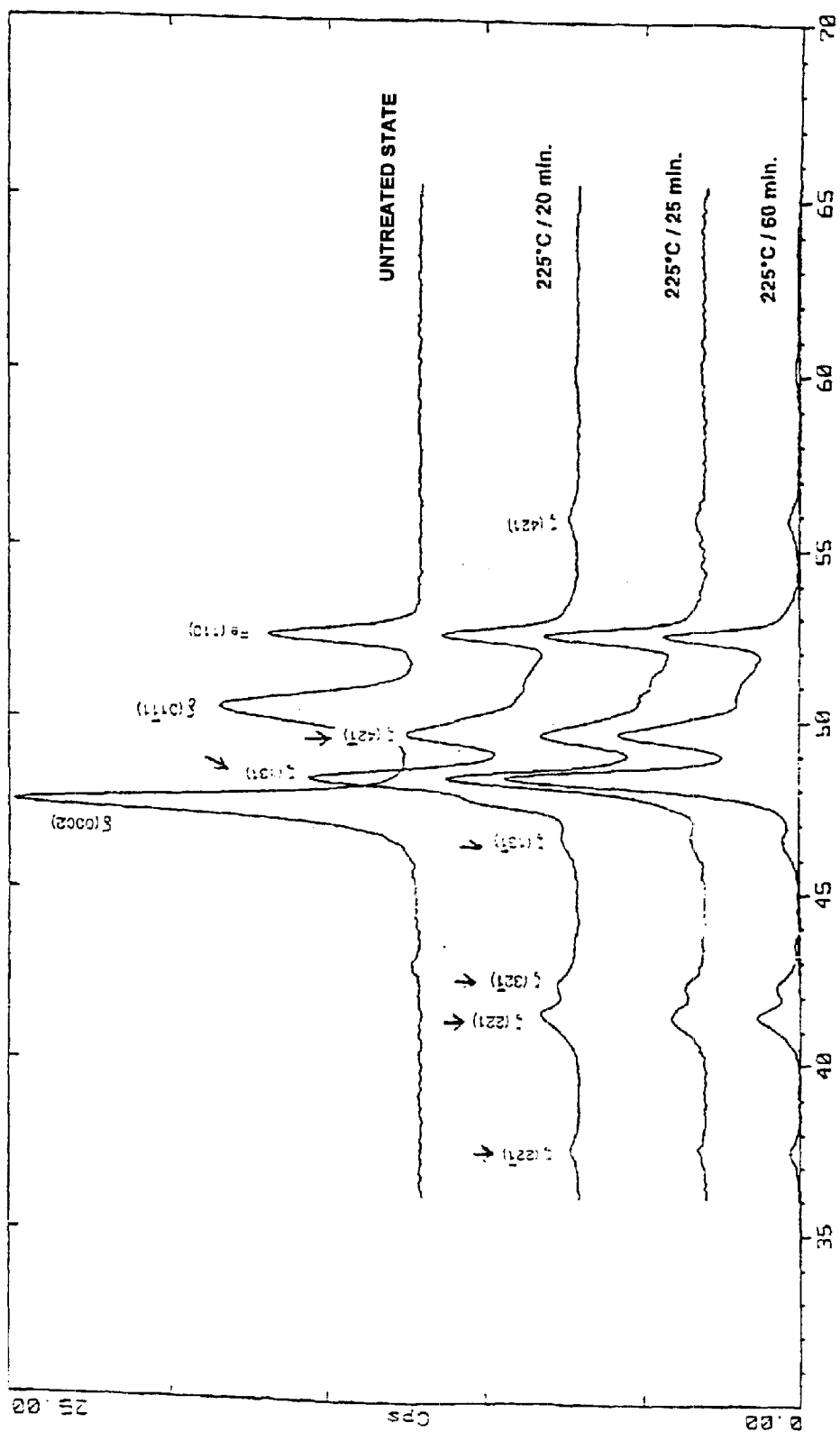
FIG. 11 illustrates, again by X-ray diffraction, the variation in the diffraction intensity of the characteristic lines of the structures of the coating for various annealing times (20, 25 and 60 minutes) at 225° C. after the coating has been deposited.

As shown by the patterns in FIG. 11, obtained on an untreated reference sheet coming directly from the deposition operation and on coated sheets which have also undergone an annealing treatment at 225° C. for a variable time (20, 25 and 60 minutes), it may be seen that:

right from annealing for 20 minutes, the ζ phase appears in a very significant proportion (lines indicated by an arrow in the figure); the left shoulder of the (131) line leaves one to believe that there is still some δ phase;

for longer times, the δ phase seems to have disappeared; the width of the main lines of the ζ phase does not decrease substantially.

2.2: by XR, with regard to the subjacent layer according to the invention:

In order to analyse the variation in the crystallographic structure of the coating as a function of the depth, a so-called "interrupted" specimen was prepared by carrying out the vacuum deposition as described previously, but with the difference that the running of the sheet is stopped while at the same time stopping the deposition, so that:

region C of the specimen stopped at region 11 (FIG. 4) comprises only the subjacent adhesion layer;

region A of the specimen stopped at region 13 (FIG. 4) comprises the entire coating as described previously;

and the intermediate regions comprise only part of the main layer; a region B of the specimen, corresponding to approximately half the thickness of the layer, is considered.

Figure 12:
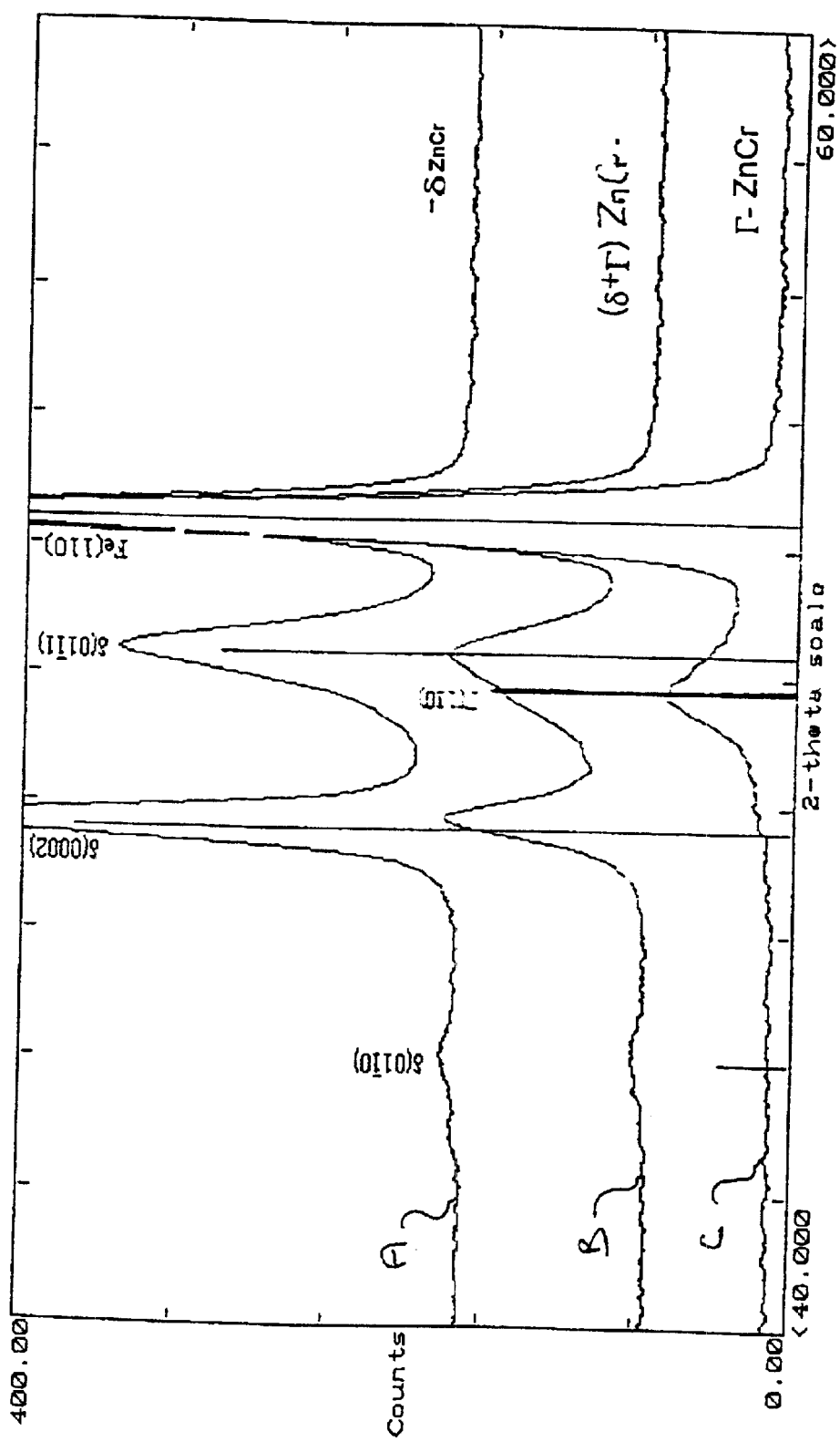
FIG. 12 illustrates, again by X-ray diffraction, the variation in the diffraction intensity of the characteristic lines of the structures of the coating as a function of the depth: curve δ-ZnCr, at the surface; curve (δ+Γ)ZnCr, at mid-thickness of the coating; curve Γ-ZnCr near the interface with the substrate.

FIG. 12 illustrates the X-ray diffraction patterns, obtained at grazing incidence, for region A (curve A), region B (curve B) and region C (curve C); mostly the δ phase is found on curve A and on curve B, which confirms the structure of the main layer of the coating; the Γ phase is detected on curve C (at 2θ≈50.000), which confirms the structure of the subjacent adhesion layer according to the invention; even a trace of the Γ phase is detected on curve B.

2.3: by electron diffraction, with regard to the subjacent layer according to the invention:

A sheet specimen provided with the coating according to the invention, as described above, is annealed at 225° C. for 1 h so as to transform the structure of the main layer of this coating to the ζ structure.

Figure 13:
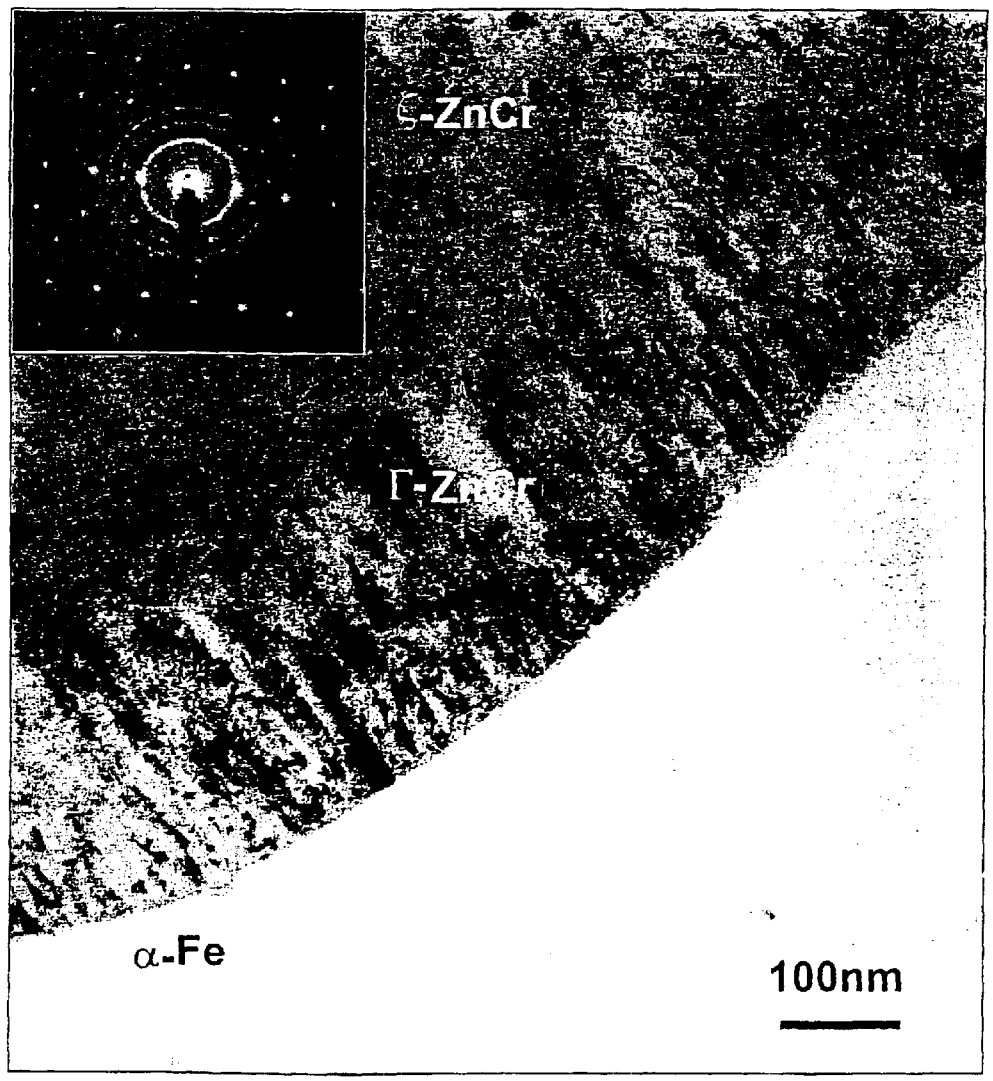
FIG. 13 is a photomicrograph at high magnification in the interface zone between the substrate and the coating, revealing the subjacent layer according to the invention, marked ZnCrΓ, and its Γ structure identified by the electron diffraction pattern in the top left corner of the photo.

A thin foil of this annealed specimen is produced by cutting in a plane perpendicular to the coating: the photograph of this section taken in a transmission electron microscope is given in FIG. 13: clearly distinguishable on the α-Fe substrate is firstly the subjacent Γ-ZnCr adhesion layer and then the start of the main ζ-ZnCr layer.

The electron diffraction pattern of the Γ-ZnCr adhesion layer is shown in the upper left corner of this photograph; this diffraction negative shows that this adhesion layer has a body-centred cubic structure ($a_0$=0.300 nm) which corresponds to the Γ-ZnCr phase (see the rings in the negative; the spots come from the [114] α-Fe substrate).

It may also be seen that:

the subjacent adhesion layer persists after annealing;

the morphology of the ζ phase is very fine: size of the crystals substantially less than 100 nm.

2.4: with regard to the interface between the substrate and the subjacent layer:

Using a sheet coated only with a Zn—Cr alloy having the Γ structure, an electron diffraction pattern is produced on thin foils obtained by cutting in the plane of the sheet.

FIG. 6 illustrates the pattern obtained: it may be seen that the diffraction rings form interrupted lines and are not complete, which indicates that the orientation of the grains of the Γ phase of the subjacent layer is not random and that there is a partial epitaxial relationship with the grains lying below the cutting plane, that is to say with the steel grains of the substrate.

3—Tests for the Adhesion of the Coating to the Steel Sheet Substrate:

Three sheet specimens are prepared:

a No. 1 specimen according to the invention, prepared under the same conditions as those described above;

a No. 2 specimen prepared under the same conditions as those described above but without using a screen 9 in the deposition plants so that the coating obtained does not include the subjacent layer according to the invention, richer in chromium than the main layer near the substrate;

a No. 3 specimen prepared under the same conditions as those described above on a clean but unreactive surface: storing it for a few days in a clean atmosphere is sufficient to make the surface unreactive.

For these three specimens, the coating comprises the same main zinc-chromium alloy layer described above: thickness approximately 4.5 μm graded δ phase.

The following coating adhesion test is carried out on these three specimen: the specimen is bent through 180°, a Scotch™-type adhesive tape is applied to the bent region, the tape applied is pulled off and then the surface of the specimen is examined to see if the coating is intact or partially pulled off or completely pulled off.

The result of the observations is as follows:

specimen No. 1: coating intact;

specimen No. 2: coating partially pulled off;

specimen No. 3: coating completely pulled off.

From this it is deduced that the sublayer according to the invention, exhibiting a partial epitaxial relationship with the steel substrate, substantially improves the adhesion of the coating based on a zinc-chromium alloy.

According to a variant of the invention, a second movable vertical screen may be placed in the coating plant, this time positioned closer to the chromium source than the zinc source so as to reduce the angle of emission from the chromium source 1 below the limit represented by the exit edge 4.

Thus, a steel sheet according to the invention is obtained, which is provided with a coating comprising:

as previously, a subjacent layer of zinc-chromium alloy much richer in chromium than the main layer;

as previously, a main layer of graded zinc-chromium alloy;

a surface layer of zinc-chromium alloy, this time much richer in zinc than the main layer.

By reversing the direction, in which the sheet runs through the vacuum coating plant described above, even in the absence of the screen 9, it is possible to obtain a sheet provided with a coating comprising:

a main layer of graded zinc-chromium alloy, this time leaner in chromium near the substrate than near the surface; and according to the invention, a subjacent layer of zinc-chromium alloy much richer in chromium than the main layer.

Figure 8A:
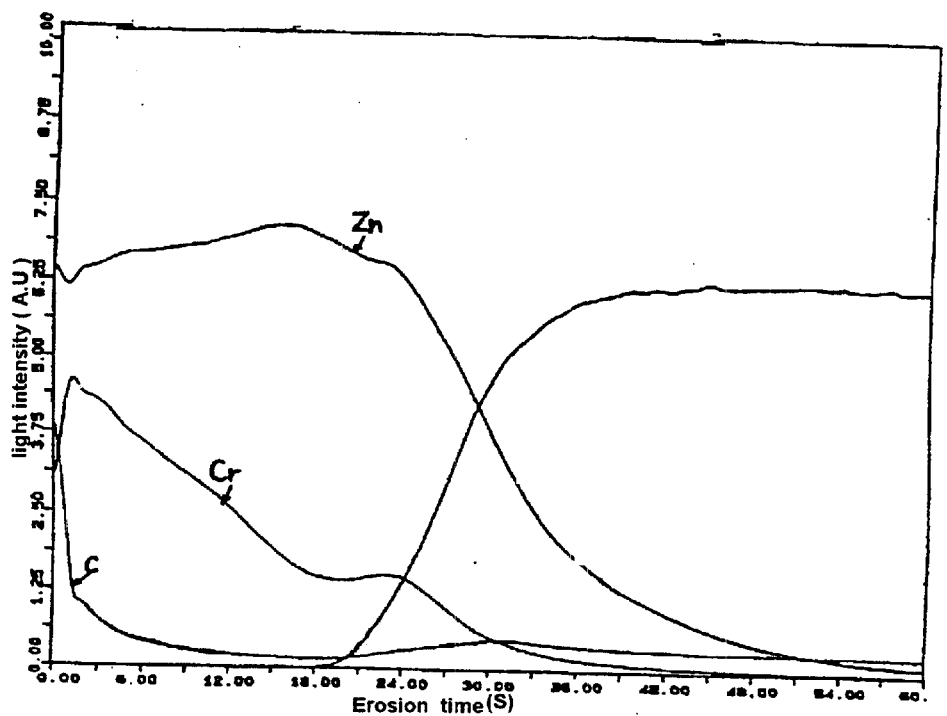
FIGS. 8A and 8B illustrate the variation in the concentration of Zn, Cr and Fe as a function of the depth with respect to the surface by glow discharge spectroscopy (signal intensity—AU: arbitrary unit as a function of the erosion time—seconds) for specimens provided with a coating according to the invention, the main layer of which is a graded layer richer in chromium towards the surface in respect of FIG. 5A and richer in chromium towards the substrate in respect of FIG. 8B.
Figure 8B:
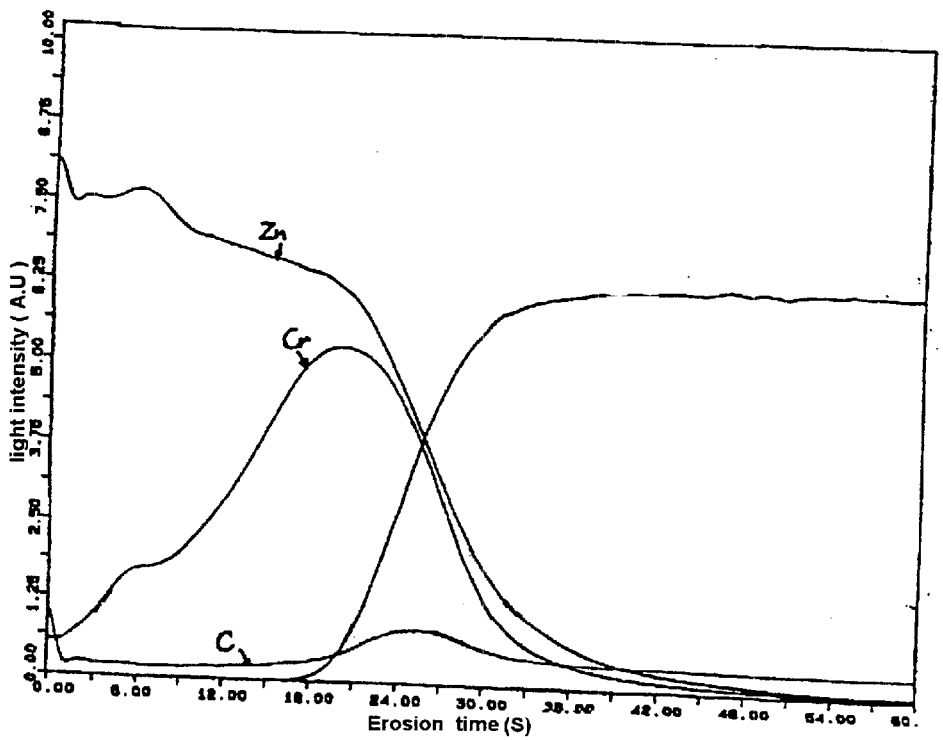

Referring to FIG. 8A, the analysis of the weight content of zinc, chromium, iron and carbon elements through the thickness of the sheet by glow discharge spectroscopy, as a function of the erosion time, clearly shows:

a reverse chromium concentration profile in the main layer of the coating, demonstrating the inversion of the gradient, namely richer in chromium near the surface than in the depth;

a chromium-enriched region at the interface between the steel substrate and the main layer of the coating, demonstrating the presence of a subjacent layer according to the invention.

What is claimed is:

1. A coating plant for obtaining a coated sheet, comprising:

means for running a sheet to be coated along a traveling path past a window for the evaporation or sublimation of elements A and B;

a source for the evaporation or sublimation of element A and a source for the evaporation or sublimation of element B, the sources placed successively in a direction parallel to the traveling path so as to emit elements A and B through the window, the sheet to be coated running from an entry edge to an exit edge of the window; and means for reducing the angle of emission from the source of element B below the limit represented by the entry edge of the window, the means for reducing the angle of emission from the source of element B being mounted so as to move translationally perpendicular to the traveling path of the sheet, and to move along the traveling path between the source of element A and the source of element B so as to obtain either a -A-AB-A- or a -B-AB-B- coating.

2. The plant according to claim 1, further comprising a means for reducing the angle of emission from the source of element A below the limit represented by the exit edge of the window, the position of the means for reducing the angle of emission from the source of element A being movable to vary between the source of element A and the source of element B so as to obtain either the -A-AB-A- or the -B-AB-B- coating.

3. The plant according to claim 1, wherein the means for reducing the angle of emission comprises at least one screen placed between the source of element A and the source of element B, the position of the screen being movable between the source of element A and the source of element B so as to obtain either the -A-AB-A- or the -B-AB-B- coating.

* * * * *